(12) United States Patent
Gruber et al.

(10) Patent No.: US 7,955,966 B2
(45) Date of Patent: Jun. 7, 2011

(54) INJECTION MOLDED SOLDER BALL METHOD

(75) Inventors: Peter A. Gruber, Mohegan Lake, NY (US); Barry A. Hochlowski, Poughkeepsie, NY (US); David T. Naugle, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/543,811

(22) Filed: Aug. 19, 2009

(65) Prior Publication Data
US 2009/0309219 A1    Dec. 17, 2009

Related U.S. Application Data

(62) Division of application No. 11/620,900, filed on Jan. 8, 2007, now abandoned.

(51) Int. Cl.
*H01L 23/498* (2006.01)
(52) U.S. Cl. .................................. 438/616; 438/613
(58) Field of Classification Search .................. 438/616, 438/613
See application file for complete search history.

(56) References Cited

U.S. PATENT DOCUMENTS

| 6,090,301 A * | 7/2000 | Mizukoshi et al. ............. 216/17 |
| 2006/0035454 A1 * | 2/2006 | Belanger et al. ............. 438/616 |

\* cited by examiner

*Primary Examiner* — David Vu
*Assistant Examiner* — Suberr Chi
(74) *Attorney, Agent, or Firm* — Connolly Bove Lodge & Hutz LLP; Vazken Alexanian

(57) ABSTRACT

Methods for making solder balls, which can be used to bump semiconductor wafers are disclosed. Methods for bumping semiconductor wafers with the solder balls are also disclosed. The solder balls can be made using an injection molded soldering (IMS) process.

9 Claims, 5 Drawing Sheets

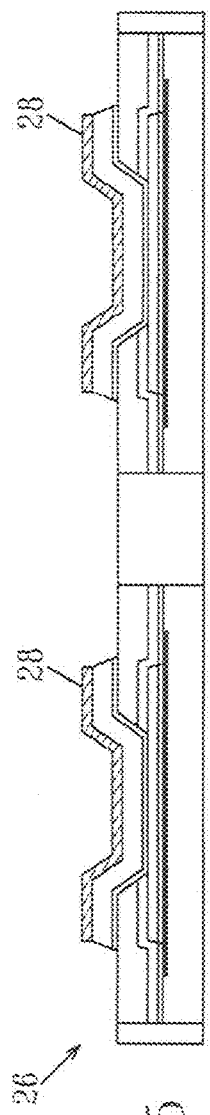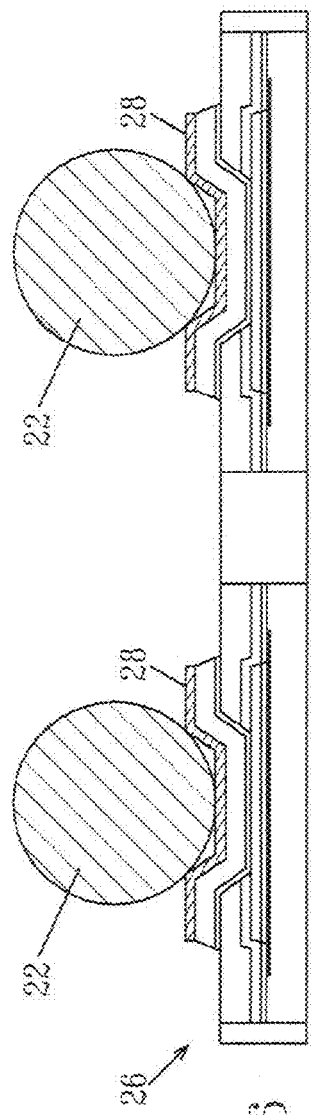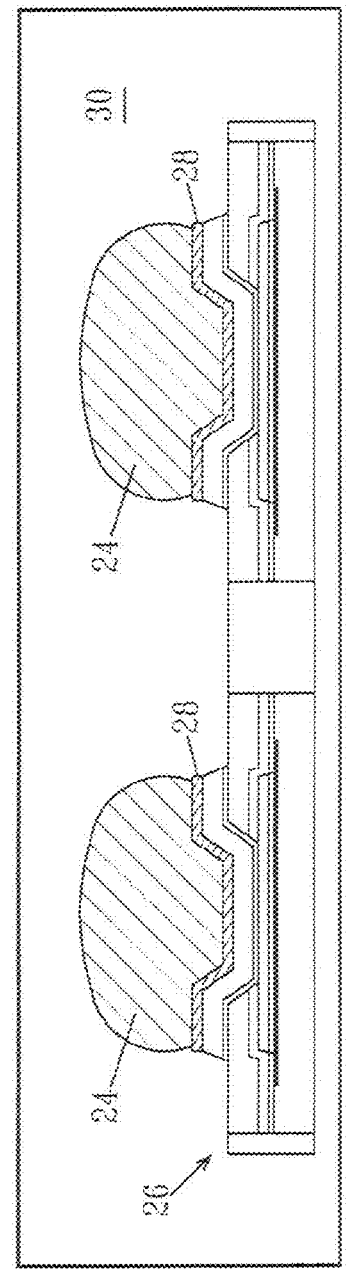
FIG. 5
FIG. 6
FIG. 7

INJECTION MOLDED SOLDER BALL METHOD

CROSS REFERENCE TO RELATED APPLICATIONS

This application is a divisional of U.S. application Ser. No. 11/620,900, the entire content of which is hereby incorporated by reference.

FIELD OF THE INVENTION

The present invention relates to a method for making solder balls that can be used to bump semiconductor wafers. The solder balls can be made using an injection molded soldering process.

BACKGROUND OF THE INVENTION

Solder bumping of semiconductor wafers is undergoing rapid evolution. Whereas past methods of evaporation, plating and paste screening have been the historical technologies, requirements such as alloy flexibility (especially for lead-free (Pb-free) alloys) and cost reductions are driving the industry towards two emerging new technologies. Included in these technologies are ball placement and injection molded solder, otherwise known as Controlled Collapse Chip Connection New Process (C4NP). This methodology focuses on using injection molded solder for significantly improving ball placement technology.

In the past, solder balls have typically been produced by a "ball drop" technique, wherein molten solder is used to produce balls having a wide range of sizes. After the production of these solder balls, a separation step based on ball size is undertaken. Using solder ball sieves of various opening sizes, the balls are separated into groups with tighter size ranges. These may then be used for various bumping applications, depending on sizes required. Elimination of this sieving step is highly desirable.

Moreover, even when the sieving step is used, a large size range may still be present in each sieved grouping, depending on the sieving matrix employed. This can lead to unsatisfactory results because in solder bumping applications, the smallest variations in bump sizes are preferred.

In view of these challenges, another method that has been disclosed for producing the solder balls is to deposit solder paste into cavities in a silicon mold. This paste is later reflowed to produce solder balls. However, this methodology possesses the same drawback that results from any paste application, namely voiding and volume reduction from paste to solder.

Voiding is a well known problem when solder paste is used. As the small solder particles agglomerate, trapping flux voids is a frequent effect. These voids in the solder balls can potentially weaken the mechanical strength of these solder balls in their interconnect applications.

Secondly, the volume reduction from paste to solder limits how closely certain sized cavities can be placed in an array, and this limits the upper range of solder bump sizes at a given pitch or spacing.

SUMMARY OF THE INVENTION

The present invention can, in at least one embodiment, provide a method for making a solder ball, which includes: providing a mold comprising at least one cavity, filling the at least one cavity with a molten solder, cooling the molten solder, and reflowing the solder to form at least one solder ball. The present invention can also provide a solder ball made by the above method.

The present invention can, in at least one further embodiment, provide a method for forming a solder bump on a semiconductor, which includes: providing a mold comprising at least one cavity, filling the at least one cavity with a molten solder, cooling the molten solder, reflowing the solder to form at least one solder ball, aligning the at least one cavity with at least one receiving pad, heating to cause the at least one solder ball to flow from the at least one cavity to the at least one receiving pad in order to form at least one solder bump, and removing the mold. The present invention can also provide a semiconductor wafer comprising a solder bump made by the above method.

BRIEF DESCRIPTION OF THE DRAWINGS

FIG. 5 is an illustrative representation of a side view of a silicon wafer containing wetting pads that are patterned to provide receiving pads for solder balls.

FIG. 6 is an illustrative representation of a side view of the wafer configuration of FIG. 5 wherein solder balls have been placed on the receiving pads.

FIG. 7 is an illustrative representation of a side view of the wafer configuration of FIG. 5, wherein solder balls have been placed on the receiving pads in an oxide reducing atmosphere to enhance the solder wetting of the pads.

DETAILED DESCRIPTION OF THE INVENTION

Figure 1A:
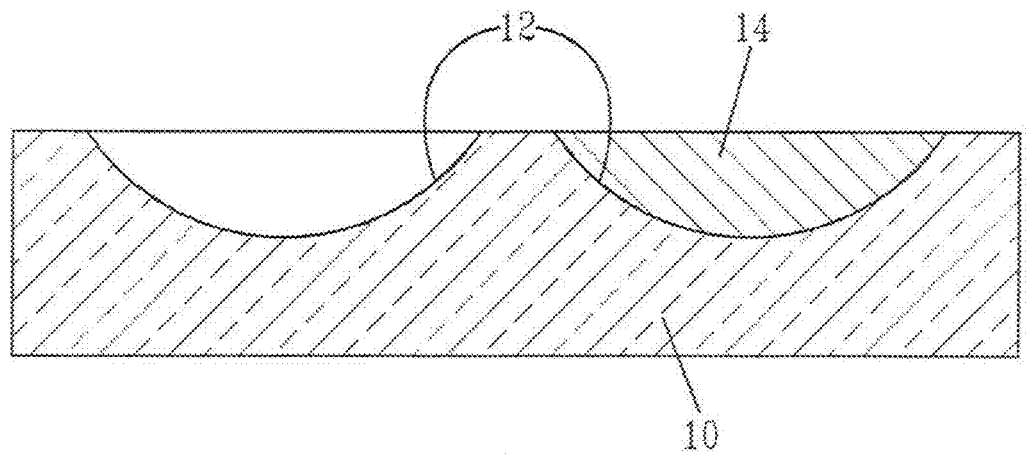
FIG. 1A is an illustrative representation of a side view of a filled injection molder solder (IMS) mold plate having round or hemispherical cavities.

The present invention, in at least one embodiment, provides a method of making solder balls that can be used in semiconductor applications, particularly solder balls that can be used in bumping semiconductor wafers. The solder balls can be made using an injection molding soldering (IMS) process, wherein molten solder is deposited in a mold cavity followed by reflowing the solder to produce the solder balls.

As used herein, the term "solder ball" refers to a ball of solder material made according to processes disclosed herein. The term solder ball includes material in any phase, including material that is in the solid or molten state. The term further includes solder material that is spherical or substantially spherical in shape. The diameter of solder balls made according to processes, while not limited, can range from, for example, about 25 microns to about 500 microns, such as from about 50 microns to about 150 microns.

Materials that can be included in solder balls (i.e., "solder material") may, for example, include Sn, and Pb, as well as alloys containing at least one of Sn and/or Pb such as, for example, SnPb, SnCu, SnAg, SnAgCu, SnCuBi, and SnAgCuBi. Among these, preferred materials include for leaded solders Sn63Pb37, Pb97Sn3 and for lead-free solders SnCu0.7, SnAg3.5, SnAg3.8Cu0.7.

In at least one embodiment of the present invention, any of the above-listed materials may be present in its substantially pure form, wherein the material is essentially free of other materials such as solder paste.

Solder balls can be produced by using an injection molding soldering (IMS) process, which includes providing a mold plate or sheet containing one or more cavities into which a molten solder material (such one or more of the above-listed materials) is deposited. As a result of the IMS process, the cavities of the mold plate or sheet are filled with the molten solder material as shown, for example, in FIGS. 1A-B and 2A-B. After filling the cavities in the mold plate or sheet, the solder material is allowed to cool and solidify after which it is allowed to reflow to form solder balls, as shown, for example in FIGS. 3A-B and 4A-B.

In at least one embodiment falling within the scope of the present invention, reflow may be accomplished in flux or other oxide reducing environment. For example, if the solder balls are a higher temperature Pb97Sn3 alloy, then reflowing in hydrogen is possible, since this environment has oxide reducing properties above about 300° C. On the other hand, if the solder is an Sn63Pb37 alloy, such as standard Sn63Pb37 with a melting temp of about 183° C., or a lead-free alloy such as SnCu0.7, such as a common SnCu0.7 alloy with a melting temp of about 227° C., then liquid flux or a formic acid vapor would be appropriate environments for reflow.

In other embodiments, fill and reflow can occur almost simultaneously. This can occur if the solder filling process is done in a very low oxygen environment. As soon as the constraining effect of the IMS solder fill head passes a row of filled cavities, the solder therein immediately "balls up" or becomes spherical. This occurs due to surface tension affecting the unoxidized solder.

While the shape of the cavities is not limited, examples of cavity shapes include round or hemispherical (such as is shown in FIGS. 1A-B and 3A-B) and pyramidal (such as is shown in FIGS. 2A-B and 4A-B). The cavities can, for example, be etched into the mold plate or sheet using, for example, a precision etching process, such as an isotropic etching process. While not limited, the diameter of cavities can, for example, range from about 25 microns to about 500 microns, such as from about 50 microns to about 150 microns. Depending on the process used to make the cavities, the depth to diameter aspect ratio of the cavities can, for example, range from about ¼ to about ½.

The arrangement of cavities in a mold plate or sheet is not limited. For example, the cavities can be arranged in a manner that mirrors the arrangement of solder receiving pads on a final substrate or wafer. The cavities can also be arranged in an array in which they are evenly spaced in one or more dimensions (such as a two-dimensional array of evenly spaced cavities). Moreover, in at least one embodiment falling within the scope of the present invention, solder balls can be formed, removed, and then rearrayed into the desired configuration. Thus, the present invention can provide a method for making solder balls where they are formed in a different configuration (for example, a more densely packed configuration) than the configuration in which they are finally arrayed.

Materials used for the mold plate or sheet, while not limited, can include glass, metal, graphite, and silicon as well as polymer materials such as polyimide sheets. For example, when cavities are round or hemispherical in shape (such as is shown in FIGS. 1A-B and 3A-B), a glass or metal mold plate or sheet may be preferred. When cavities are pyramidal in shape (such as is shown in FIGS. 2A-B and 4A-B), a silicon mold plate or sheet may be preferred, the pyramidal shape being produced by anisotropic etching in <100> silicon wafers.

The temperature of the soldier material during various stages of processes falling within the scope of the present invention will, of course, depend on the specific solder material or materials used. For example, standard eutectic SnPb solder has a melting point of about 183° C., a lead-free alloy such as standard SnCu has a melting point of about 227° C., and standard high lead PbSn3 has a melting point of about 323° C. Processing temperatures are typically kept about 20° C. above the melting point for both cavity filling as well as reflow.

At least one embodiment falling within the scope of the present invention may overcome at least one deficiency associated with methods used in the prior art. For example, at least one embodiment of the present invention can provide solder balls having volumes that are as uniform as the individual cavities in the mold plate or sheet (where, for example, essentially pure molten material is deposited into precision etched cavities that are then solidified with a flat top as shown in FIGS. 1A-B and 2A-B). Such size distribution can be expected to be tighter that what would typically be achieved by plating or by the solder ball sieving method used with the ball drop technology.

In addition, since embodiments of the invention can be practiced without the use of solder paste, solder balls made according to such embodiments can be expected to have relatively fewer voids and, as a result, may be expected to have better overall mechanical properties. In addition, since essentially pure molten solder can be used, solder balls can be produced in which there is little volume change from molten to solid, which can result in more closely spaced arrays that produce more balls at a given volume.

Various aspects falling within the scope of the invention will now be further described with reference to the figures.

Figure 1B:
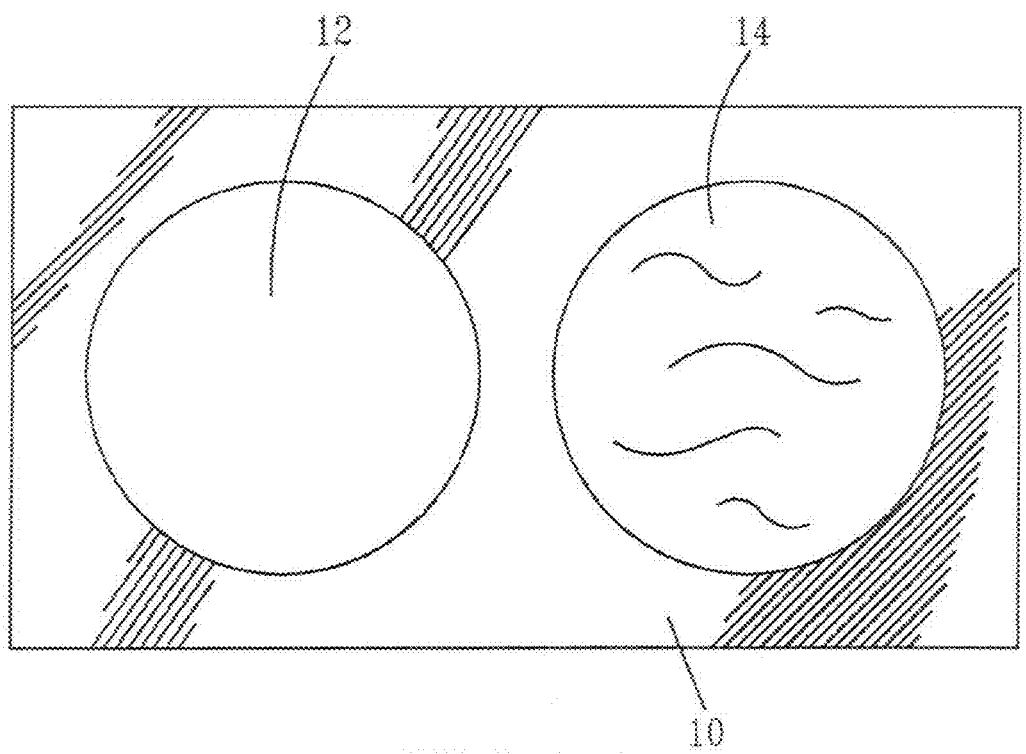
FIG. 1B is an illustrative representation of a top view of a filled IMS mold plate having round or hemispherical cavities.

An injection molded solder (IMS) method is used to fill cavities in a mold plate or sheet. FIG. 1 illustrates a side view (FIG. 1A) and a top view (FIG. 1B) of hemispherical cavities 12, which are produced by a precision etching process, such as isotropic etching in a mold plate 10 such as glass or metal. Once filled with solder 14, these are ready to be reflowed.

Figure 2A:
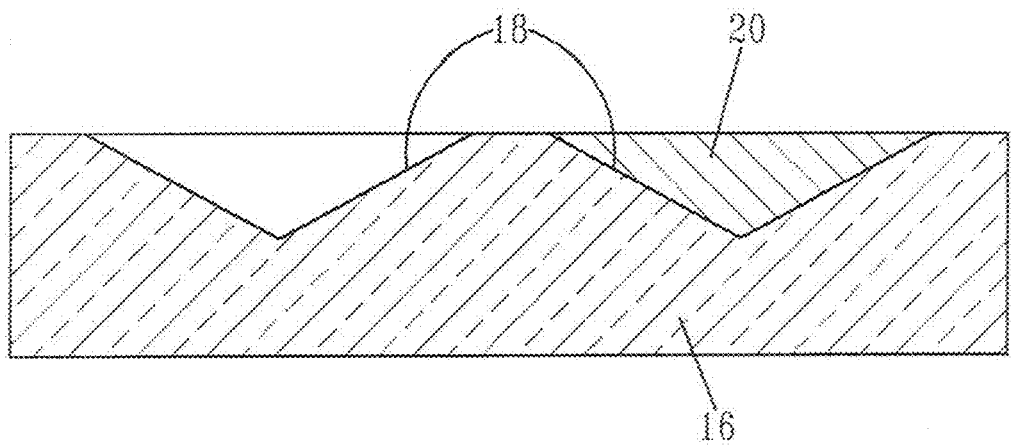
FIG. 2A is an illustrative representation of a side view of a filled IMS mold plate having pyramidal cavities.
Figure 2B:
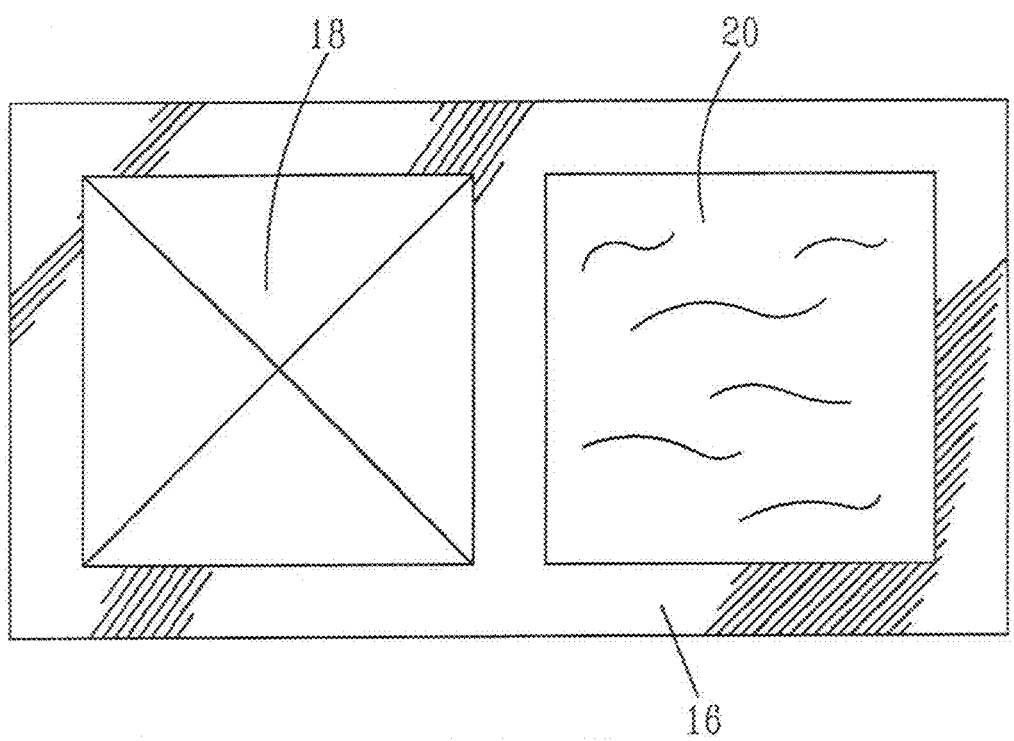
FIG. 2B is an illustrative representation of a top view of a filled IMS mold plate having pyramidal cavities.

FIG. 2 illustrates a side view (FIG. 2A) and a top view (FIG. 2B) of pyramidal shaped cavities 18, which are produced by a precision etching process in a mold plate 16 such as silicon (for example, 1-0-0 silicon). Once filled with solder 20, these are ready for reflow.

Figure 3A:
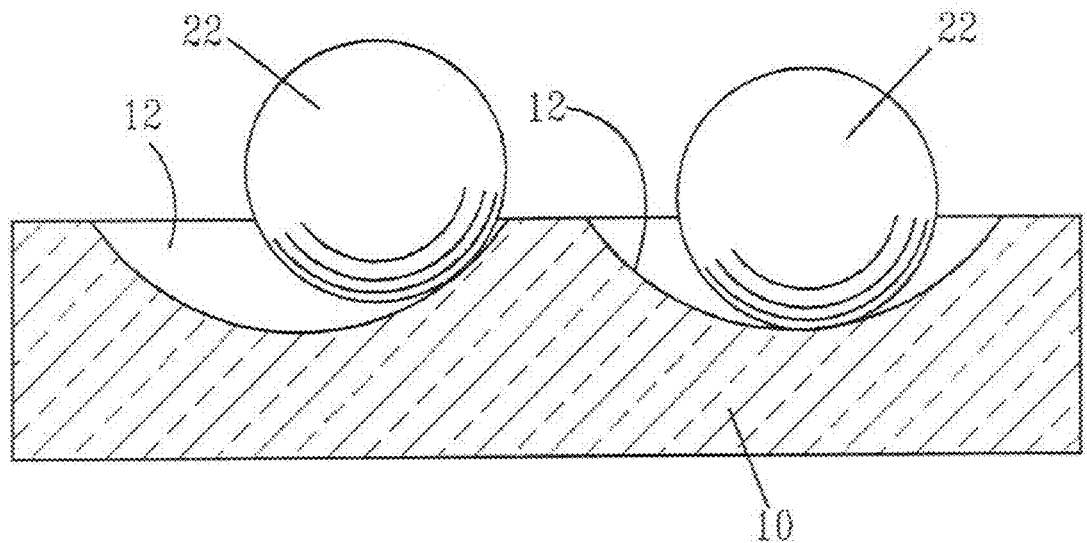
FIG. 3A is an illustrative representation of a side view of reflowed solder balls in an IMS mold plate having round or hemispherical cavities.
Figure 3B:
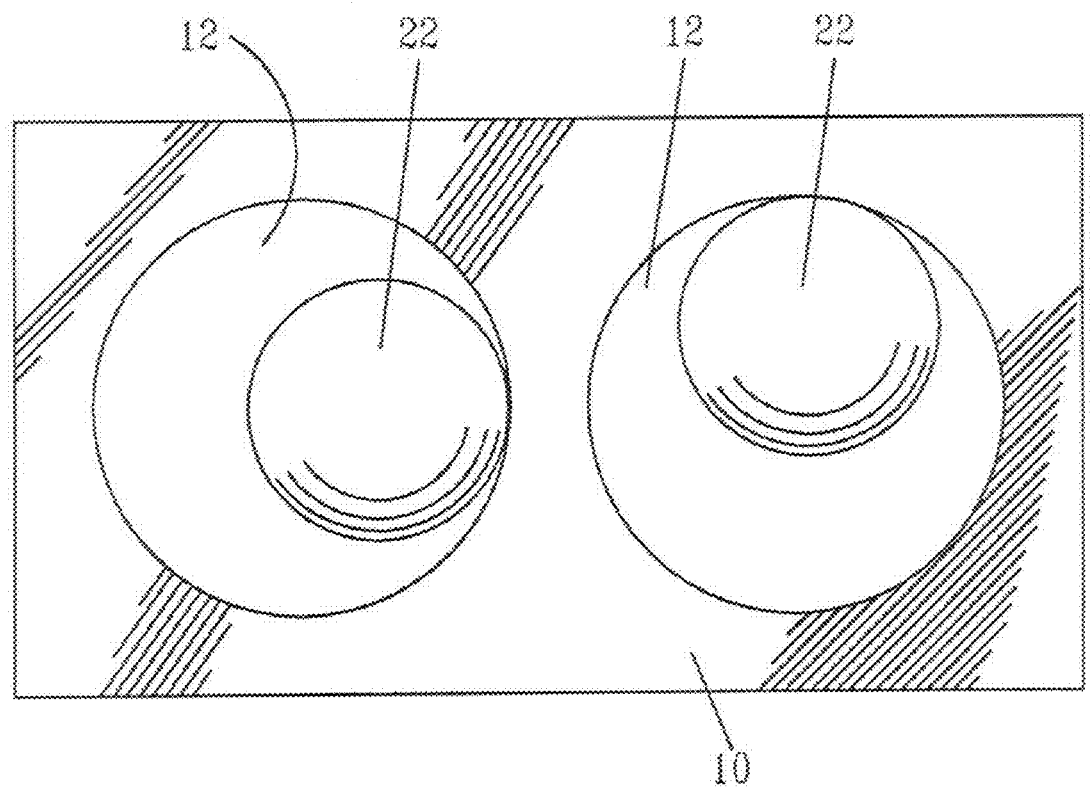
FIG. 3B is an illustrative representation of a top view of reflowed solder balls in an IMS mold plate having round or hemispherical cavities.

FIG. 3 illustrates a side view (FIG. 3A) and a top view (FIG. 3B) of solder reflowed to produce spherical solder balls 22. FIG. 3B illustrates that when hemispherical cavities 12 are etched in mold plate 10, the solder balls 22 when reflowed may adhere to any part of the cavity side wall. Although not problematic for extracting solder balls, this potential for slight non-uniform location of reflowed balls can be eliminated by using silicon mold plates as seen in FIG. 4.

Figure 4A:
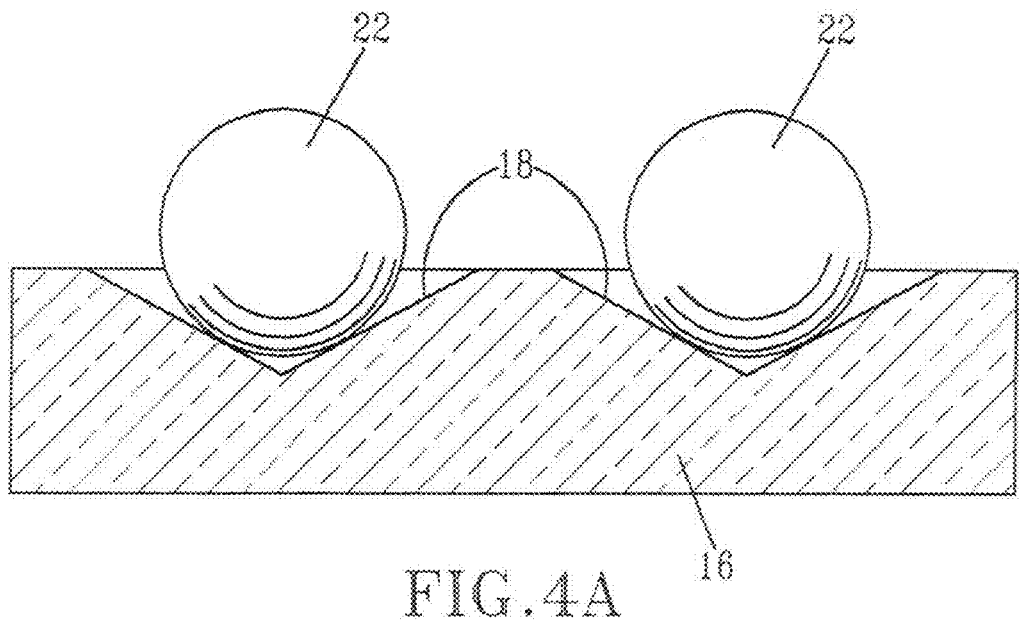
FIG. 4A is an illustrative representation of a side view of reflowed solder balls in an IMS mold plate having pyramidal cavities.
Figure 4B:
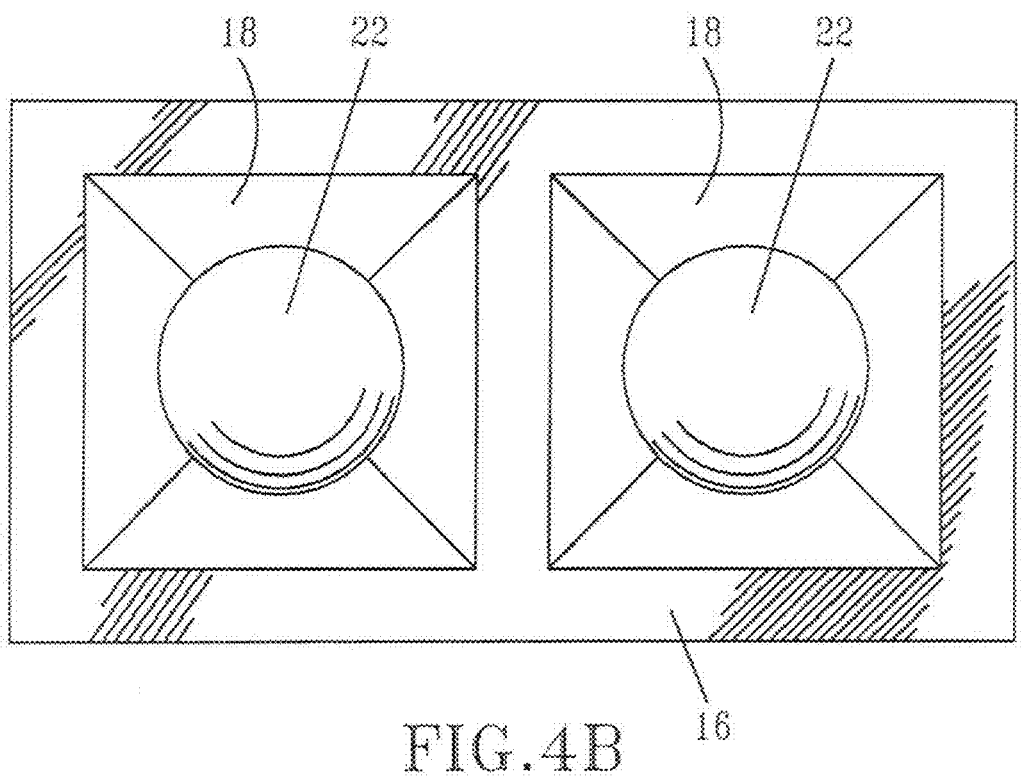
FIG. 4B is an illustrative representation of a top view of reflowed solder balls in an IMS mold plate having pyramidal cavities.

FIG. 4 also illustrates a side view (FIG. 4A) and a top view (FIG. 4B) of solder reflowed to produce spherical solder balls 22. Here, as shown in FIG. 4B, the pyramidal shape of each cavity 18 etched in mold plate 16 insures that each reflowed solder ball 22 stays at the center of each cavity.

The location of solder balls within individual cavities may or may not impact solder ball retrieval methods. For example, if the balls are simply globally dislodged and amassed, such location will not matter. The balls can simply be cooled and removed from the mold cavity. However, if the balls are individually retrieved, then the centered balls, as shown in FIG. 4B, will be easier to retrieve.

FIG. 5 illustrates a side view of a substrate 26 containing wetting pads 28 that are patterned as receiving pads for the solder balls. While not limited to any specific materials, the substrate can, for example, be selected from silicon wafers as well as organic and ceramic materials and the receiving wetting pads can, for example be selected from Cr, Cu, CrCu, Ti, TiW, N, and Au. The dimensions of the substrate 26 and wetting pads 28 are also not limited and can, for example range from 1"-12" round silicon wafers and 1" or larger square or rectangular organic or ceramic and about 25 to about 500 microns for the receiving pads, but are usually preferred in a range such as from about 6"-12" round silicon wafers and about 50 to about 150 microns for the receiving pads. Solder balls as formed with this method may be subsequently attached to these substrates through any of several known solder ball placement methods, such as vacuum assisted arraying fixtures.

FIG. 6 illustrates the wafer configuration of FIG. 5 where solder balls 22 have been placed on receiving pad locations 28 of the wafer 26. Depending on the transfer scheme, flux may or may not be required to achieve wetting of the solder ball 22 to the wetting pad. For many applications, a fluxing agent may be used to facilitate oxide reduction of both solder ball and wetting pad in non-gold top pad metallurgies. These may be applied by any of several well known methods such as spray, brush, etc and removed after wetting and ball attach by standard solvent means.

FIG. 7 illustrates solder balls that have wetted the pads to form solder bumps 24 on wafer 26. An oxide reducing atmosphere 30, such as formic acid, may be used to enhance the solder wetting of the pads (such as in situations where flux is not desired).

EXAMPLES

An example of an injection molded solder ball method can be described as follows:

A <100> silicon wafer was patterned with square openings in a photoresist layer and subsequently etched to produce precise, self-limiting pyramidal shaped cavities of 100 microns on an edge with a spacing between cavities of 200 microns. This silicon mold plate was then scanned by an IMS (Injection Molded Solder) head, which filled the cavities with SnPb eutectic solder.

In the example, the solder was solidified in the cavities, the contrast of the bright metallic solder and dark silicon enhancing a manual fill inspection. Such process may be readily automated for manufacturing.

To enable efficient "ball-up" of the solder in the cavities, a thin layer of flux may be used while heating the mold plate about 20° C. above the eutectic melt point (about 183° C. for SnPb). Under such conditions, a surface tension induced change in shape of the solder from the as-molded pyramid to a sphere occurs, resulting in a full array of solder balls sit in the pyramidal cavities.

While the present invention has been described in an illustrative manner, it should be understood that the terminology used is intended to be in a nature of words or description rather than of limitation. Furthermore, while the present invention has been described in terms of several illustrative embodiments, it is to be appreciated that those skilled in the art will readily apply these teachings to other possible variations of the inventions.

What is claimed as new and desired to be protected by Letters Patent of the United States is:

1. A method for forming a solder bump on a semiconductor wafer comprising:
   providing a mold comprising at least one cavity;
   filling said at least one cavity with a molten solder in a low oxygen environment;
   reflowing the solder to form at least one solder ball as soon as a constraining effect of a solder fill head has passed the at least one cavity;
   aligning the at least one cavity with at least one receiving pad;
   heating to cause the at least one solder ball to flow from the at least one cavity to the at least one receiving pad in order to form at least one solder bump; and
   removing the mold,
   wherein the shape of the at least one cavity is pyramidal.

2. The method of claim 1, wherein the molten solder comprises at least one material selected from the group consisting of Sn, Pb, SnPb, SnCu, SnAg, SnBi, SnAgCu, and SnAgCuBi.

3. The method of claim 1, wherein the mold comprises at least one material selected from the group consisting of glass, silicon, metal, graphite, and polyimide.

4. The method of claim 1, wherein the diameter of the cavity ranges from about 25 microns to about 500 microns.

5. The method of claim 1, wherein the diameter of the solder ball ranges from about 25 microns to about 500 microns.

6. The method of claim 1, wherein the semiconductor wafer comprises <100> silicon.

7. The method of claim 1, wherein the at least one receiving pad comprises at least one material selected from the group consisting of Cr, Cu, CrCu, Ti, TiW, N, and Au.

8. The method of claim 1, wherein the step of heating to cause the at least one solder ball to flow from the at least one cavity to the at least one receiving pad in order to form at least one solder bump is conducted in an oxide reducing atmosphere.

9. The method of claim 8, wherein the oxide reducing atmosphere comprises formic acid.

* * * * *